United States Patent
Kimura

(10) Patent No.: US 10,454,448 B2
(45) Date of Patent: Oct. 22, 2019

(54) ELASTIC WAVE DEVICE

(71) Applicant: Murata Manufacturing Co., Ltd., Nagaokakyo-shi, Kyoto-fu (JP)

(72) Inventor: Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 520 days.

(21) Appl. No.: 15/236,594

(22) Filed: Aug. 15, 2016

(65) Prior Publication Data
US 2016/0352305 A1 Dec. 1, 2016

Related U.S. Application Data

(63) Continuation of application No. PCT/JP2015/054768, filed on Feb. 20, 2015.

(30) Foreign Application Priority Data

Mar. 14, 2014 (JP) .................................. 2014-051299

(51) Int. Cl.
*H03H 9/145* (2006.01)
*H03H 9/02* (2006.01)

(52) U.S. Cl.
CPC .... *H03H 9/14541* (2013.01); *H03H 9/02228* (2013.01); *H03H 9/02559* (2013.01); *H03H 9/02834* (2013.01)

(58) Field of Classification Search
CPC .......... H03H 9/14541; H03H 9/02834; H03H 9/02559
See application file for complete search history.

(56) References Cited

U.S. PATENT DOCUMENTS

2013/0285768 A1* 10/2013 Watanabe ............ H03H 9/0222
333/193
2014/0145556 A1 5/2014 Kadota
(Continued)

FOREIGN PATENT DOCUMENTS

CN 1943109 A 4/2007
CN 103262410 A 8/2013
(Continued)

OTHER PUBLICATIONS

Official Communication issued in corresponding Japanese Patent Application No. 2016-507424, dated Jul. 25, 2017.
(Continued)

*Primary Examiner* — J. San Martin
(74) *Attorney, Agent, or Firm* — Keating & Bennett, LLP

(57) ABSTRACT

An elastic wave device includes an IDT electrode provided on a main surface of a $LiTaO_3$ substrate, and uses plate waves in an SH0 mode, which is a basic mode of SH waves. A wavelength-normalized thickness of the $LiTaO_3$ substrate normalized by a wavelength determined by a pitch of electrode fingers of the IDT electrode, and an Al equivalent wavelength-normalized thickness of the IDT electrode satisfy any one of combinations listed in the following table:

| | |
|---|---|
| (a) | The wavelength-normalized thickness is about 0.01 or more and about 0.30 or less, and the wavelength-normalized thickness of Al is about 0.04 or more and about 0.1 or less. |
| (b) | The wavelength-normalized thickness is about 0.01 or more and about 0.70 or less, and the wavelength-normalized thickness of Al is about 0.04 or more and about 0.08 or less. |

20 Claims, 6 Drawing Sheets

(56) References Cited

U.S. PATENT DOCUMENTS

| | | |
|---|---|---|
| 2014/0152145 A1 | 6/2014 | Kando et al. |
| 2014/0152146 A1 | 6/2014 | Kimura et al. |
| 2014/0203893 A1 | 7/2014 | Kando et al. |
| 2015/0061466 A1* | 3/2015 | Kimura ............... H01L 41/18 310/365 |
| 2015/0102705 A1 | 4/2015 | Iwamoto et al. |
| 2018/0159497 A1* | 6/2018 | Iwamoto ............... H03H 9/25 |
| 2018/0159507 A1* | 6/2018 | Goto ............... H01L 41/0477 |
| 2018/0205362 A1* | 7/2018 | Kishimoto ............ H03H 9/145 |

FOREIGN PATENT DOCUMENTS

| | | |
|---|---|---|
| CN | 103283147 A | 9/2013 |
| JP | 2001-285021 A | 10/2001 |
| JP | 2004-260381 A | 9/2004 |
| JP | 2007-221840 A | 8/2007 |
| JP | 2008-306422 A | 12/2008 |
| JP | 2010-220204 A | 9/2010 |
| JP | 2012-257019 A | 12/2012 |
| JP | 5367612 B2 | 12/2013 |
| WO | 2012/073871 A1 | 6/2012 |
| WO | 2012/086441 A1 | 6/2012 |
| WO | 2012/086639 A1 | 6/2012 |
| WO | 2013/021948 A1 | 2/2013 |
| WO | 2013/047433 A1 | 4/2013 |
| WO | 2013/191122 A1 | 12/2013 |

OTHER PUBLICATIONS

Official Communication issued in Chinese Patent Application No. 201580008512.5, dated Jan. 29, 2018.

English translation of Official Communication issued in corresponding International Application PCT/JP2015/054768, dated Apr. 21, 2015.

Official Communication issued in Chinese Patent Application No. 201580008512.5, dated Sep. 29, 2018.

* cited by examiner $S_0$ MODE LAMB WAVE $S_1$ MODE LAMB WAVE $A_0$ MODE LAMB WAVE $A_1$ MODE LAMB WAVE $SH_0$ MODE $SH_1$ MODE

ELASTIC WAVE DEVICE

CROSS REFERENCE TO RELATED APPLICATIONS

This application claims the benefit of priority to Japanese Patent Application 2014-051299 filed Mar. 14, 2014 and is a Continuation Application of PCT/JP2015/054768 filed on Feb. 20, 2015, the entire contents of each application are hereby incorporated herein by reference.

BACKGROUND OF THE INVENTION

1. Field of the Invention

The present invention relates to an elastic wave device using plate waves, and more specifically relates to an elastic wave device including a $LiTaO_3$ substrate.

2. Description of the Related Art

SH wave devices using $LiTaO_3$ are conventionally provided. For example, Japanese Unexamined Patent Application Publication No. 2004-260381 described below discloses an SH wave device using an SH0 mode, that is, a basic mode of SH waves. Japanese Unexamined Patent Application Publication No. 2004-260381 discloses that the use of a $LiTaO_3$ substrate of a predetermined thickness brings about a temperature coefficient of delay TCD of approximately 0. It is also described that in the case of an SH wave device used in a 10 MHz band, forming an electrode material film of gold or aluminum into a film thickness of the order of 0.2 µm brings about a TCD of approximately 0.

When normalizing the film thickness of the electrode film described in Japanese Unexamined Patent Application Publication No. 2004-260381 by a wavelength determined by the pitch of electrode fingers of the SH wave device, the Al equivalent wavelength-normalized thickness of an IDT electrode becomes extremely thin i.e. $0.000625\lambda$. That is to say, the electrode film must be formed extremely thin, i.e., 0.1% or less of the wavelength. In the case of use at a frequency of the order of 10 MHz, just as with an embodiment of the Japanese Unexamined Patent Application Publication No. 2004-260381, the film thickness of the electrode film is not so thin, i.e., on the order of 0.2 µm. However, the film thickness of the electrode film becomes 4 nm in the case of use at a high frequency band of 500 MHz, and the film thickness of the electrode film becomes approximately 2 nm in the case of use in a 1 GHz band. Thus, the resistance of electrode fingers significantly increases with a decrease in the film thickness of the electrode film. This results in an increase in loss. In addition, when the film thickness of the electrode film becomes too thin, the electrode fingers of a minute pitch are very difficult to form with high precision.

SUMMARY OF THE INVENTION

Preferred embodiments of the present invention provide an elastic wave device that uses plate waves in an SH0 mode propagating through a $LiTaO_3$ substrate, that includes an IDT electrode having a thicker Al equivalent wavelength-normalized thickness than before, that has favorable temperature characteristics, and that is manufactured easily.

An elastic wave device according to a preferred embodiment of the present invention includes a $LiTaO_3$ substrate and an IDT electrode provided on a main surface of the $LiTaO_3$ substrate. The IDT electrode is made of Al or predominantly made of Al. The elastic wave device uses a plate wave in an SH0 mode, which is a basic mode of SH waves. In a preferred embodiment of the present invention, a wavelength-normalized thickness of the $LiTaO_3$ substrate that is a thickness of the $LiTaO_3$ substrate normalized by a wavelength determined by a pitch of electrode fingers of the IDT electrode, and an Al equivalent wavelength-normalized thickness of the IDT electrode satisfy any one of combinations listed in the following Table 1.

TABLE 1

| | |
|---|---|
| (a) | The wavelength-normalized thickness is about 0.01 or more and about 0.30 or less, and the wavelength-normalized thickness of Al is about 0.04 or more and about 0.1 or less. |
| (b) | The wavelength-normalized thickness is about 0.01 or more and about 0.70 or less, and the wavelength-normalized thickness of Al is about 0.04 or more and about 0.08 or less. |

An elastic wave device according to a preferred embodiment of the present invention includes a $LiTaO_3$ substrate and an IDT electrode provided on a main surface of the $LiTaO_3$ substrate. The IDT electrode is made of Al or predominantly made of Al. The elastic wave device uses a plate wave in an SH0 mode, which is a basic mode of SH waves.

In this preferred embodiment of the present invention, a wavelength-normalized thickness of the $LiTaO_3$ substrate that is a thickness of the $LiTaO_3$ substrate normalized by a wavelength determined by a pitch of electrode fingers of the IDT electrode, and a duty of the IDT electrode satisfy any one of combinations listed in the following Table 2.

TABLE 2

| | |
|---|---|
| (a) | The wavelength-normalized thickness is about 0.07 or more and about 0.21 or less, and the duty is about 0.3 or more and about 0.7 or less. |
| (b) | The wavelength-normalized thickness is about 0.03 or more and about 0.27 or less, and the duty is about 0.3 or more and about 0.6 or less. |
| (c) | The wavelength-normalized thickness is about 0.01 or more and about 0.30 or less, and the duty is about 0.3 or more and about 0.5 or less. |
| (d) | The wavelength-normalized thickness is about 0.01 or more and about 0.32 or less, and the duty is about 0.3 or more and about 0.4 or less. |

An elastic wave device according to a preferred embodiment of the present invention includes a $LiTaO_3$ substrate including a first main surface and a second main surface on an opposite side of the first main surface; an IDT electrode provided on the first main surface of the $LiTaO_3$ substrate, the IDT electrode is made of Al or predominantly made of Al; and a conductive film provided on the second main surface of the $LiTaO_3$ substrate so as to be opposed to the IDT electrode across the $LiTaO_3$ substrate. The elastic wave device uses a plate wave in an SH0 mode, which is a basic mode of SH waves. The conductive film is not short-circuited.

In this preferred embodiment of the present invention, a wavelength-normalized thickness of the $LiTaO_3$ substrate that is a thickness of the $LiTaO_3$ substrate normalized by a wavelength determined by a pitch of electrode fingers of the IDT electrode, and an Al equivalent wavelength-normalized thickness of the IDT electrode satisfy any one of combinations listed in the following Table 3.

TABLE 3

| | |
|---|---|
| (a) | The wavelength-normalized thickness is about 0.01 or more and about 0.59 or less, and the wavelength-normalized thickness of Al is about 0.04 or more and about 0.1 or less. |
| (b) | The wavelength-normalized thickness is about 0.01 or more and about 0.70 or less, and the wavelength-normalized thickness of Al is about 0.04 or more and about 0.08 or less. |

An elastic wave device according to a preferred embodiment of the present invention includes a LiTaO$_3$ substrate including a first main surface and a second main surface on an opposite side of the first main surface; an IDT electrode provided on the first main surface of the LiTaO$_3$ substrate, the IDT electrode is made of Al or predominantly made of Al; and a conductive film provided on the second main surface of the LiTaO$_3$ substrate so as to be opposed to the IDT electrode across the LiTaO$_3$ substrate. The elastic wave device uses a plate wave in an SH0 mode, which is a basic mode of SH waves. The conductive film is not short-circuited.

In this preferred embodiment of the present invention, a wavelength-normalized thickness of the LiTaO$_3$ substrate, which is a thickness of the LiTaO$_3$ substrate normalized by a wavelength determined by a pitch of electrode fingers of the IDT electrode, and a duty of the IDT electrode satisfy any one of combinations listed in the following Table 4.

TABLE 4

| | |
|---|---|
| (a) | The wavelength-normalized thickness is about 0.05 or more and about 0.45 or less, and the duty is about 0.3 or more and about 0.7 or less. |
| (b) | The wavelength-normalized thickness is about 0.02 or more and about 0.52 or less, and the duty is about 0.3 or more and about 0.6 or less. |
| (c) | The wavelength-normalized thickness is about 0.01 or more and about 0.58 or less, and the duty is about 0.3 or more and about 0.5 or less. |
| (d) | The wavelength-normalized thickness is about 0.01 or more and about 0.66 or less, and the duty is about 0.3 or more and about 0.4 or less. |

An elastic wave device according to a preferred embodiment of the present invention includes a LiTaO$_3$ substrate including a first main surface and a second main surface on an opposite side of the first main surface; an IDT electrode provided on the first main surface of the LiTaO$_3$ substrate, the IDT electrode is made of Al or predominantly made of Al; and a conductive film provided on the second main surface of the LiTaO$_3$ substrate so as to be opposed to the IDT electrode across the LiTaO$_3$ substrate. The elastic wave device uses a plate wave in an SH0 mode, which is a basic mode of SH waves. The conductive film is short-circuited.

In this preferred embodiment of the present invention, a wavelength-normalized thickness of the LiTaO$_3$ substrate, which is a thickness of the LiTaO$_3$ substrate normalized by a wavelength determined by a pitch of electrode fingers of the IDT electrode, and an Al equivalent wavelength-normalized thickness of the IDT electrode satisfy any one of combinations listed in the following Table 5.

TABLE 5

| | |
|---|---|
| (a) | The wavelength-normalized thickness is about 0.01 or more and about 0.7 or less, and the wavelength-normalized thickness of Al is about 0.04 or more and about 0.1 or less. |

An elastic wave device according to a preferred embodiment of the present invention includes a LiTaO$_3$ substrate including a first main surface and a second main surface on an opposite side of the first main surface; an IDT electrode provided on the first main surface of the LiTaO$_3$ substrate, the IDT electrode is made of Al or predominantly made of Al; and a conductive film provided on the second main surface of the LiTaO$_3$ substrate so as to be opposed to the IDT electrode across the LiTaO$_3$ substrate. The elastic wave device uses a plate wave in an SH0 mode, which is a basic mode of SH waves. The conductive film is short-circuited.

In this preferred embodiment of the present invention, a wavelength-normalized thickness of the LiTaO$_3$ substrate, which is a thickness of the LiTaO$_3$ substrate normalized by a wavelength determined by a pitch of electrode fingers of the IDT electrode, and a duty of the IDT electrode satisfy any one of combinations listed in the following Table 6.

TABLE 6

| | |
|---|---|
| (a) | The wavelength-normalized thickness is about 0.05 or more and about 0.60 or less, and the duty is about 0.3 or more and about 0.7 or less. |
| (b) | The wavelength-normalized thickness is about 0.02 or more and about 0.68 or less, and the duty is about 0.3 or more and about 0.6 or less. |
| (c) | The wavelength-normalized thickness is about 0.01 or more and about 0.70 or less, and the duty is about 0.3 or more and about 0.5 or less. |

According to various preferred embodiments of the present invention, it is possible to provide an elastic wave device that uses a plate wave in an SH0 mode, that has favorable temperature characteristics, and that is manufactured easily.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings to clarify the present invention.

First Preferred Embodiment

Figure 1A:
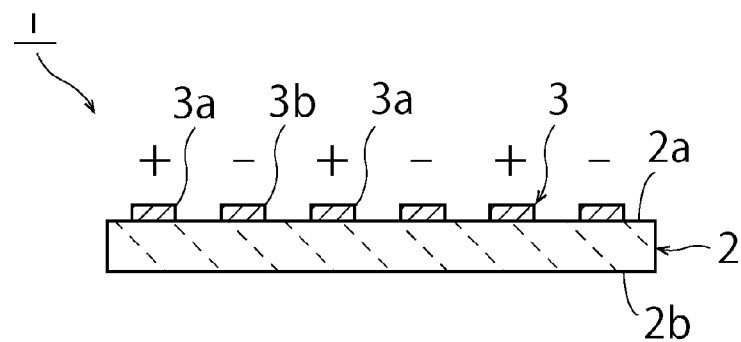
FIG. 1A is a front sectional view of an elastic wave device according to a first preferred embodiment of the present invention.
Figure 1B:
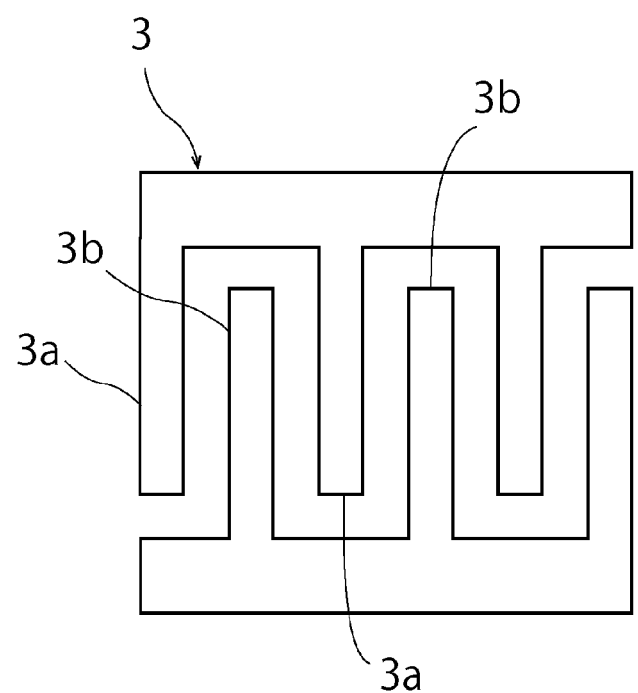
FIG. 1B is a schematic plan view showing the structure of an electrode thereof.

FIG. 1A is a front sectional view of an elastic wave device according to a first preferred embodiment of the present invention, and FIG. 1B is a schematic plan view showing the structure of an electrode thereof.

An elastic wave device 1 includes a LiTaO$_3$ substrate 2. The Euler angles of the LiTaO$_3$ substrate 2 are preferably within the ranges of (0°±5°, 120°±10°, 0°±5°). In these ranges, plate waves in an SH0 mode are efficiently excited.

The LiTaO$_3$ substrate 2 includes a first main surface 2a and a second main surface 2b on the opposite side of the first main surface 2a.

On the first main surface 2a, an IDT electrode 3 is provided. FIG. 1B shows the structure of the IDT electrode 3. The IDT electrode 3 includes a plurality of electrode fingers 3a and a plurality of electrode fingers 3b. The plurality of electrode fingers 3a and the plurality of electrode fingers 3b are interdigitated with one another.

Note that, although not specifically illustrated, another IDT electrode may be also provided on the second main surface 2b so as to be opposed to the IDT electrode 3 across the LiTaO$_3$ substrate 2.

The IDT electrode 3 is made of Al in this preferred embodiment. Alternatively, the IDT electrode 3 may be predominantly made of Al. Here, an electrode that is predominantly made of Al refers to a structure made of an alloy containing Al of about 50 weight % or more, or a structure including Al of about 50 weight % or more in a multilayer structure of an Al film and another metal film.

The elastic wave device 1 uses plate waves in an SH0 mode, that is, a basic mode of SH waves in which an SH component predominates. Note that, the SH waves predominate not only in the SH0 mode but also in higher order modes such as an SH1 mode. The reason why the SH waves are referred to as predominating is that excited plate waves include components other than the SH waves.

Figure 2A:
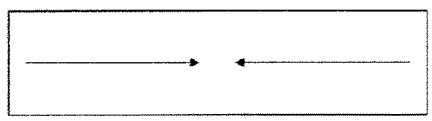
FIGS. 2A to 2F are schematic views that explain an S0 mode, an S1 mode, an A0 mode, an A1 mode, an SH0 mode, and an SH1 mode, respectively.
Figure 2B:
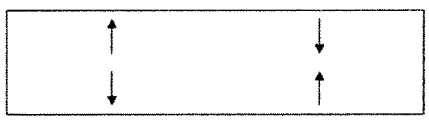
Figure 2C:
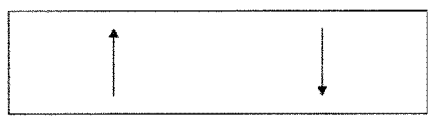
Figure 2D:
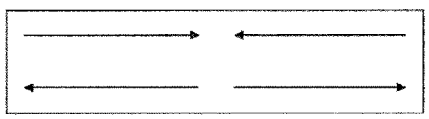
Figure 2E:
Figure 2F:

Plate waves are classified into Lamb waves (predominantly including components in a propagation direction of elastic waves and a piezoelectric thickness direction) and SH waves (predominantly include SH components) according to their displacement components. Moreover, the Lamb waves are classified into a symmetric mode (S mode) and an anti-symmetric mode (A mode). In the symmetric mode, displacements coincide with respect to a half line in the thickness of a piezoelectric body. In the anti-symmetric mode, displacements are opposite in direction. A number indicates the number of nodes in the thickness direction. Here, an A1 mode Lamb wave refers to a Lamb wave in a first order anti-symmetric mode. FIG. 2A to FIG. 2F shows the S modes and the A modes of the Lamb waves and propagation modes of the SH waves. In FIGS. 2A to 2D, arrows indicate the displacement directions of the elastic waves. In FIGS. 2E and 2F, the directions perpendicular or substantially perpendicular to the plane of paper correspond to the displacement directions of the elastic waves.

The inventors of preferred embodiments of the present invention made various studies in order to improve temperature characteristics and simplify a manufacturing process with the use of a LiTaO$_3$ substrate and an electrode having Al as a main constituent. As a result of this, the inventors have discovered that restrictions on the thickness, i.e., the wavelength-normalized thickness of the LiTaO$_3$ substrate and the thickness of the IDT electrode or a duty within specific ranges achieve the above advantages, and thus conceived of and developed preferred embodiments of the present invention. This will be described in more detail below.

Figure 5:
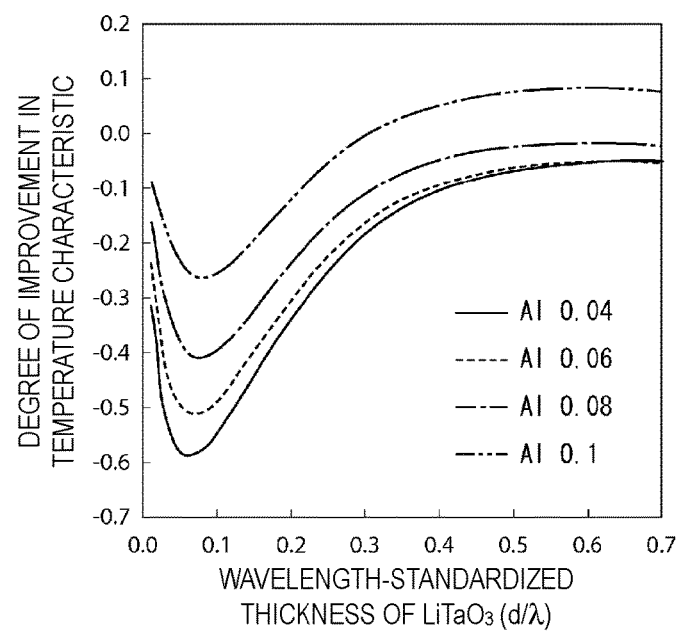
FIG. 5 is a graph showing the relationship among the wavelength-normalized thickness of an Al film, the wavelength-normalized thickness of a LiTaO$_3$ substrate, and the degree of improvement in a temperature characteristic in the elastic wave device according to the first preferred embodiment of the present invention.

FIG. 5 shows the relationship among the wavelength-normalized thickness of the LiTaO$_3$ substrate 2, the wavelength-normalized thickness of an Al film of the IDT electrode 3, and the degree of improvement in a temperature characteristic in the elastic wave device according to the first preferred embodiment.

In the elastic wave device 1 according to the above preferred embodiment, the Euler angles of the LiTaO$_3$ substrate 2 were (0°, 120°, 0°). The duty of the IDT electrode 3 was about 0.5.

Note that, the wavelength-normalized thicknesses refer to normalized values of the thicknesses of the LiTaO$_3$ substrate and the electrode having Al as a main constituent by a wavelength λ that is determined by the pitch of the electrode fingers of the IDT electrode 3.

The degree of improvement in a temperature characteristic (TCF$_{SHO}$−TCF$_{SAW}$)/TCF$_{SAW}$ represents the degree of improvement in a temperature coefficient of a frequency TCF. To be more specific, a surface acoustic wave device for communication use was prepared as a reference device. The surface acoustic wave device as the reference device has the following specifications:

Substrate: a LiTaO$_3$ substrate having Euler angles of (0°, 132°, 0°).

IDT electrode: made of an Al film, and having a wavelength-normalized thickness h/λ=0.1.

Duty of the IDT electrode=0.5.

TCF$_{SAW}$ represents the frequency-temperature characteristic of the surface acoustic wave device, as the reference device, at a resonant frequency. TCF$_{SHO}$ described in the above degree of improvement in the temperature characteristic represents a temperature coefficient of a resonant frequency of the elastic wave device using the SH0 mode according to this preferred embodiment. Thus, (TCF$_{SHO}$−TCF$_{SAW}$)/TCF$_{SAW}$ indicates the degree of improvement in the TCF of the elastic wave device of this preferred embodiment with respect to the TCF of the above reference device. If the temperature characteristic TCF$_{SHO}$ of the above elastic wave device 1 is superior, the degree of improvement in the temperature characteristic shown in FIG. 5 indicates a negative value. On the contrary, if the temperature coefficient of the resonant frequency TCF of the conventional surface acoustic wave device is superior, a positive value is taken in a vertical axis of FIG. 5.

As an instance, the $TCF_{SH0}$ of the elastic wave device of the above preferred embodiment is about −20 ppm/° C. and the $TCF_{SAW}$ of the above surface acoustic wave device is about −50 ppm/° C. In this instance, the degree of improvement in the temperature characteristic is about {−20−(−50)}/(−50)=−0.6. That is to say, in this instance, the TCF of the elastic wave device 1 is improved by about 60% with respect to the conventional surface acoustic wave device.

As is apparent from FIG. 5, the degree of improvement in the temperature characteristic varies with variations in the thickness of Al and the thickness of the LiTaO₃ substrate. It was discovered and confirmed that when any one of combinations listed in the following Table 7 is satisfied, the degree of improvement in the temperature characteristic, as shown in FIG. 5, is less than 0. Thus, by choosing the wavelength-normalized thickness of the LiTaO₃ substrate 2 and the wavelength-normalized thickness of Al so as to satisfy any one of the combinations listed in the Table 7, the temperature characteristic is able to be improved. Also, in this case, the wavelength-normalized thickness of Al is about 0.04 or more, thus allowing easy manufacture even with an increase in a frequency.

TABLE 7

| | |
|---|---|
| (a) | The wavelength-normalized thickness is about 0.01 or more and about 0.30 or less, and the wavelength-normalized thickness of Al is about 0.04 or more and about 0.1 or less. |
| (b) | The wavelength-normalized thickness is about 0.01 or more and about 0.70 or less, and the wavelength-normalized thickness of Al is about 0.04 or more and about 0.08 or less. |

Figure 6:
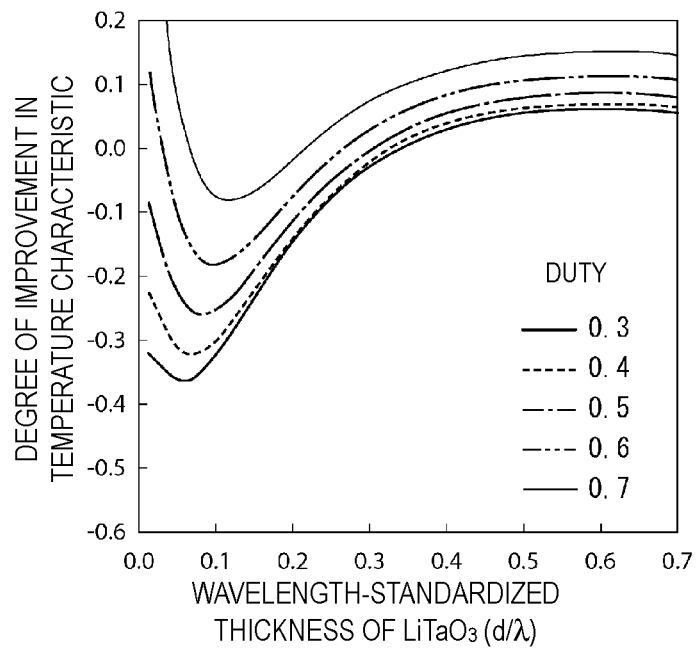
FIG. 6 is a graph showing the relationship among a duty, the wavelength-normalized thickness of the LiTaO$_3$ substrate, and the degree of improvement in the temperature characteristic in the elastic wave device according to the first preferred embodiment of the present invention.

FIG. 6 shows variations in the degree of improvement in the temperature characteristic with variations in the duty of the IDT electrode and the thickness of the LiTaO₃ substrate. Note that, the duty was varied between about 0.3 and about 0.7 inclusive, and the wavelength-normalized thickness of Al constituting the IDT electrode 3 was about 0.1. The Euler angles of the LiTaO₃ substrate 2 were (0°, 120°, 0°).

As is apparent from FIG. 6, by choosing the thickness of the LiTaO₃ substrate and the duty from any one of combinations listed in the following Table 8, the degree of improvement in the temperature characteristic becomes less than 0.

TABLE 8

| | |
|---|---|
| (a) | The wavelength-normalized thickness is about 0.07 or more and about 0.21 or less, and the duty is about 0.3 or more and about 0.7 or less. |
| (b) | The wavelength-normalized thickness is about 0.03 or more and about 0.27 or less, and the duty is about 0.3 or more and about 0.6 or less. |
| (c) | The wavelength-normalized thickness is about 0.01 or more and about 0.30 or less, and the duty is about 0.3 or more and about 0.5 or less. |
| (d) | The wavelength-normalized thickness is about 0.01 or more and about 0.32 or less, and the duty is about 0.3 or more and about 0.4 or less. |

Therefore, adopting any one of the combinations listed in the Table 8 achieves improvement in the temperature characteristic. Also, since the wavelength-normalized thickness of Al is about 0.1, it is possible to provide an easily manufactured elastic wave device.

Second Preferred Embodiment

Figure 3:
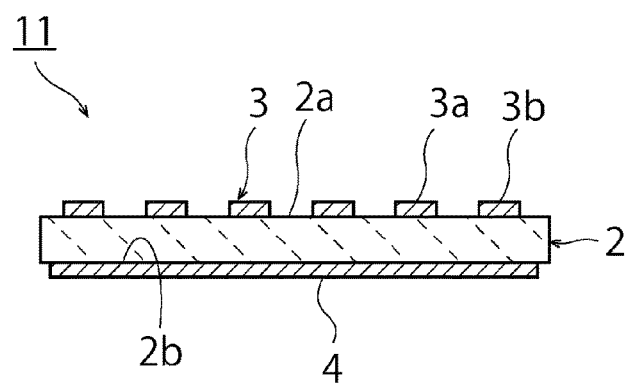
FIG. 3 is a front sectional view of an elastic wave device according to a second preferred embodiment of the present invention.

FIG. 3 is a front sectional view of an elastic wave device according to a second preferred embodiment of the present invention. In an elastic wave device 11 according to the second preferred embodiment, a conductive film 4 is provided on a second main surface 2b of a LiTaO₃ substrate 2. Except for providing of the conductive film 4, the elastic wave device 11 has the same structure as the elastic wave device 1. In the second preferred embodiment, the conductive film 4 is not short-circuited. In other words, the conductive film 4 is electrically floating.

The conductive film 4 is made of Al. Alternatively, the conductive film 4 may be predominantly made of Al. Alternatively, the conductive film 4 may be made of another metal, instead of being made of Al or predominantly made of Al.

In the elastic wave device 11 according to the second preferred embodiment, the application of an alternating voltage to an IDT electrode 3 excites plate waves in an SH0 mode. Also in this case, when the Euler angles of the LiTaO₃ substrate 2 are within the range of (0°±5°, 120°±10°, 0°±5°), SH waves are efficiently excited.

Figure 7:
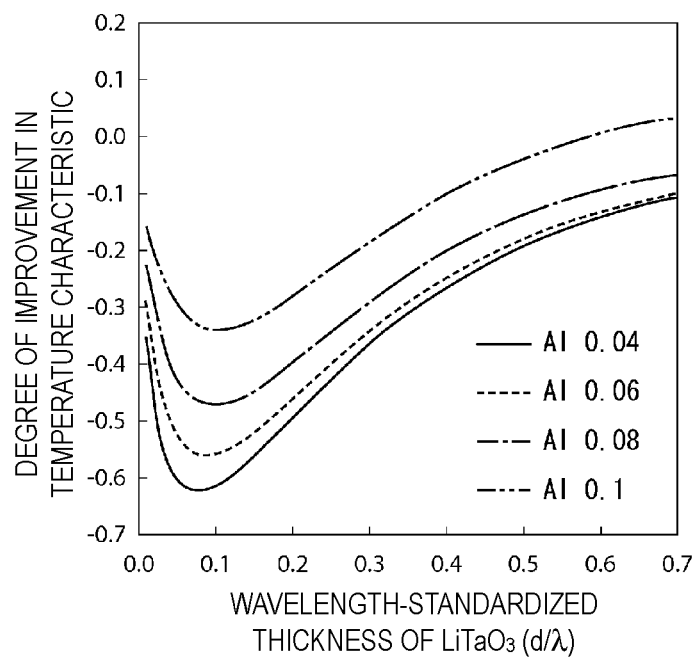
FIG. 7 is a graph showing the relationship among the wavelength-normalized thickness of an Al film, the wavelength-normalized thickness of a LiTaO$_3$ substrate, and the degree of improvement in a temperature characteristic in the elastic wave device according to the second preferred embodiment of the present invention.

FIG. 7 shows the relationship among the thickness i.e. wavelength-normalized thickness of the LiTaO₃ substrate 2, the wavelength-normalized thickness of an Al film of the IDT electrode 3, and the degree of improvement in a temperature characteristic in the elastic wave device according to the second preferred embodiment.

Note that, the Euler angles of the LiTaO₃ substrate 2 were (0°, 120°, 0°). The duty of the IDT electrode 3 was about 0.5. The conductive film 4 made of Al had a thickness of about 50 nm. As $TCF_{SAW}$ in an evaluation of the degree of improvement in the temperature characteristic, the temperature coefficient of the resonant frequency of the reference device used in the experiment example of the first preferred embodiment was used.

As is apparent from FIG. 7, the degree of improvement in the temperature characteristic varies with variations in the thickness of Al and the thickness of the LiTaO₃ substrate. It was discovered and confirmed that when any one of combinations listed in the following Table 9 is satisfied, the degree of improvement in the temperature characteristic, as shown in FIG. 7, is less than 0. Therefore, by choosing the wavelength-normalized thickness of LiTaO₃ substrate 2 and selecting the wavelength-normalized thickness of Al so as to satisfy any one of the combinations listed in the Table 9, the degree of improvement in the temperature coefficient is achieved. Also, in this case, the wavelength-normalized thickness of Al is about 0.04 or more, thus allowing easy manufacture even with an increase in a frequency.

TABLE 9

| | |
|---|---|
| (a) | The wavelength-normalized thickness is about 0.01 or more and about 0.59 or less, and the wavelength-normalized thickness of Al is about 0.04 or more and about 0.1 or less. |
| (b) | The wavelength-normalized thickness is about 0.01 or more and about 0.70 or less, and the wavelength-normalized thickness of Al is about 0.04 or more and about 0.08 or less. |

Figure 8:
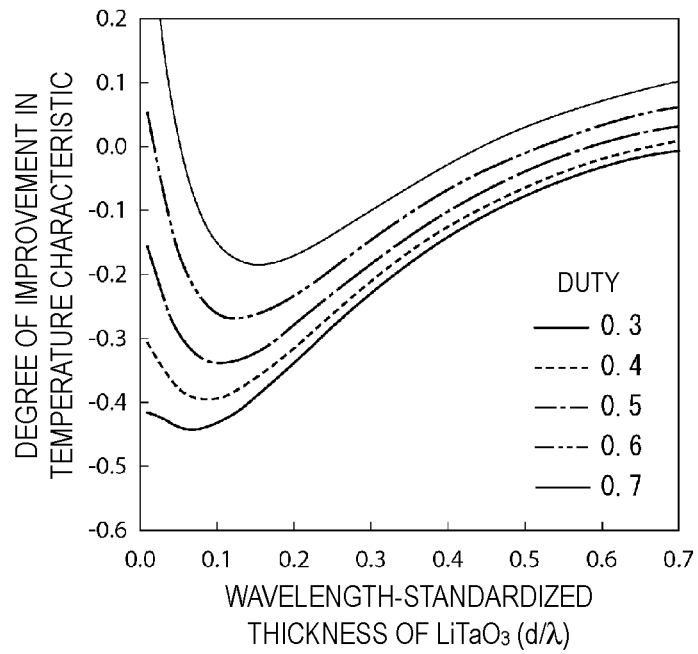
FIG. 8 is a graph showing the relationship among a duty, the wavelength-normalized thickness of the LiTaO$_3$ substrate, and the degree of improvement in the temperature characteristic in the elastic wave device according to the second preferred embodiment of the present invention.

FIG. 8 shows variations in the degree of improvement in the temperature characteristic with variations in the duty of the IDT electrode and the thickness of the LiTaO₃ substrate. Note that, the duty was varied between about 0.3 and about 0.7 inclusive, and the wavelength-normalized thickness of Al of the IDT electrode 3 was about 0.1.

Note that, the Euler angles of the LiTaO₃ substrate 2 were (0°, 120°, 0°). The conductive film 4 made of the Al film had a thickness of about 50 nm.

As is apparent from FIG. 8, by choosing the thickness of the LiTaO$_3$ substrate and the duty from any one of combinations listed in the following Table 10, the degree of improvement in the temperature characteristic becomes less than 0.

TABLE 10

| | |
|---|---|
| (a) | The wavelength-normalized thickness is about 0.05 or more and about 0.45 or less, and the duty is about 0.3 or more and about 0.7 or less. |
| (b) | The wavelength-normalized thickness is about 0.02 or more and about 0.52 or less, and the duty is about 0.3 or more and about 0.6 or less. |
| (c) | The wavelength-normalized thickness is about 0.01 or more and about 0.58 or less, and the duty is about 0.3 or more and about 0.5 or less. |
| (d) | The wavelength-normalized thickness is about 0.01 or more and about 0.66 or less, and the duty is about 0.3 or more and about 0.4 or less. |

Therefore, adopting any one of the combinations listed in the Table 10 allows improvement in the temperature characteristic. Also, since the wavelength-normalized thickness of Al is about 0.1, it is possible to provide an easily manufactured elastic wave device.

Third Preferred Embodiment

Figure 4:
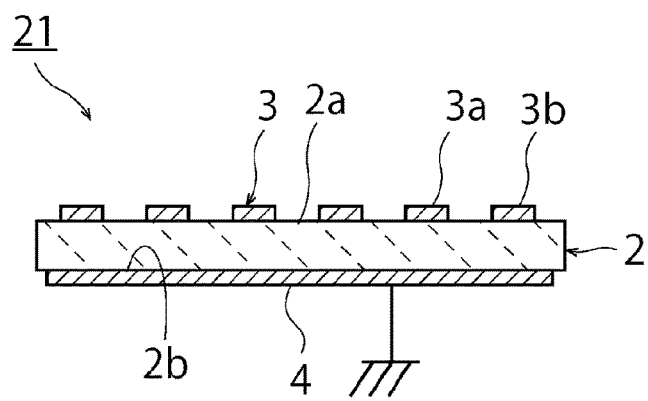
FIG. 4 is a front sectional view of an elastic wave device according to a third preferred embodiment of the present invention.

FIG. 4 is a front sectional view of an elastic wave device according to a third preferred embodiment of the present invention. In an elastic wave device 21, a conductive film 4 is provided on a second main surface 2b of a LiTaO$_3$ substrate 2. The conductive film 4 is connected to a ground voltage and short-circuited. Except for providing the conductive film 4, the elastic wave device 21 has the same structure as the elastic wave device 1. Thus, the same reference numerals will refer to the same elements and the description thereof will be omitted.

The conductive film 4 is made of Al. Alternatively, the conductive film 4 may be predominantly made of Al. Alternatively, the conductive film 4 may be made of another metal, instead of being made of Al or predominantly made of Al.

Figure 9:
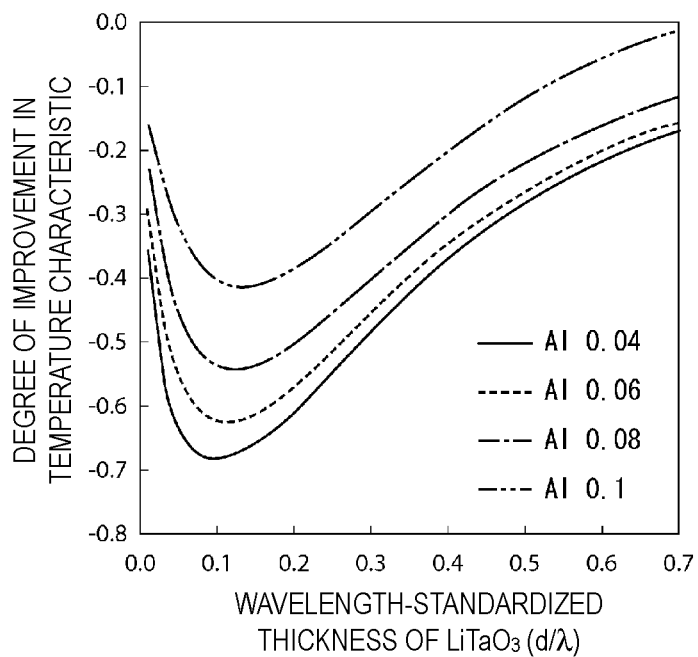
FIG. 9 is a graph showing the relationship among the wavelength-normalized thickness of an Al film, the wavelength-normalized thickness of a LiTaO$_3$ substrate, and the degree of improvement in a temperature characteristic in the elastic wave device according to the third preferred embodiment of the present invention.

FIG. 9 shows the relationship among the thickness, i.e., wavelength-normalized thickness of the LiTaO$_3$ substrate 2, the wavelength-normalized thickness of an Al film of the IDT electrode 3, and the degree of improvement in a temperature characteristic in the elastic wave device according to the third preferred embodiment.

In the third preferred embodiment, the Euler angles of the LiTaO$_3$ substrate 2 were (0°, 120°, 0°). The duty of the IDT electrode 3 was about 0.5. The conductive film 4 made of the Al film had a thickness of about 50 nm.

As is apparent from FIG. 9, the degree of improvement in the temperature characteristic varies with variations in the thickness of Al and the thickness of the LiTaO$_3$ substrate. It was discovered and confirmed that when a combination listed in the following Table 11 is satisfied, the degree of improvement in the temperature characteristic, as shown in FIG. 9, is less than 0. Therefore, by choosing the wavelength-normalized thickness of the LiTaO$_3$ substrate 2 and the wavelength-normalized thickness of Al so as to satisfy the combination listed in the following Table 11, it is possible to improve the temperature characteristic. Also, in this case, the wavelength-normalized thickness of Al is about 0.04 or more, thus allowing easy manufacture even with an increase in a frequency.

TABLE 11

| | |
|---|---|
| (a) | The wavelength-normalized thickness is about 0.01 or more and about 0.7 or less, and the wavelength-normalized thickness of Al is about 0.04 or more and about 0.1 or less. |

Figure 10:
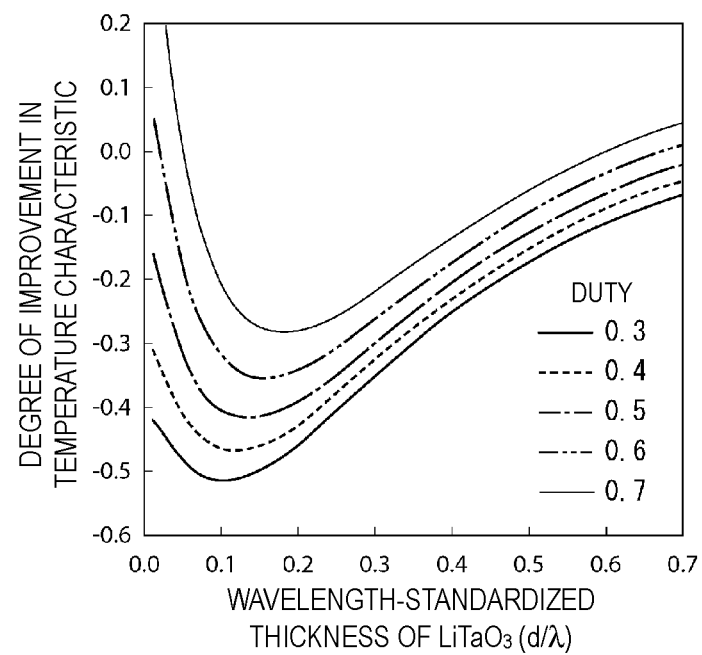
FIG. 10 is a graph showing the relationship among a duty, the wavelength-normalized thickness of the LiTaO$_3$ substrate, and the degree of improvement in the temperature characteristic in the elastic wave device according to the third preferred embodiment of the present invention.

FIG. 10 shows variations in the degree of improvement in the temperature characteristic with variations in the duty of the IDT electrode and the thickness of the LiTaO$_3$ substrate. Note that, the duty was varied between about 0.3 and about 0.7 inclusive, and the wavelength-normalized thickness of Al of the IDT electrode 3 was about 0.1.

As is apparent from FIG. 10, by choosing the thickness of the LiTaO$_3$ substrate and the duty from any one of combinations listed in the following Table 12, the degree of improvement in the temperature characteristic becomes less than 0.

TABLE 12

| | |
|---|---|
| (a) | The wavelength-normalized thickness is about 0.05 or more and about 0.60 or less, and the duty is about 0.3 or more and about 0.7 or less. |
| (b) | The wavelength-normalized thickness is about 0.02 or more and about 0.68 or less, and the duty is about 0.3 or more and about 0.6 or less. |
| (c) | The wavelength-normalized thickness is about 0.01 or more and about 0.70 or less, and the duty is about 0.3 or more and about 0.5 or less. |

Therefore, adopting any one of the combinations listed in the Table 12 allows improvement in the temperature characteristic and providing an easily manufactured elastic wave device.

As described above, the IDT electrode according to the preferred embodiments may include a multilayer body of an Al film and another metal film, as long as the IDT electrode includes Al as a main constituent. In this case, an Al equivalent wavelength-normalized thickness may be used as the wavelength-normalized thickness of the IDT electrode. The Al equivalent wavelength-normalized thickness means a converted thickness that corresponds to the thickness of an Al film, when Al is used as a main constituent. For example, when the multilayer body includes an Al film and a Pt film, the wavelength-normalized thickness of the Al film is about 0.05 and the wavelength-normalized thickness of the Pt film is about 0.005. In this case, the Al equivalent wavelength-normalized thickness of the entire IDT electrode is about 0.05+0.005×7.926=0.0896. Here, about 7.926 is the ratio between the density of Pt and the density of Al, that is, 21400/2700=7.926. Note that, as a matter of course, when the IDT electrode is made of only Al, the Al equivalent wavelength-normalized thickness is equal to the wavelength-normalized thickness of an Al film.

Note that, the above preferred embodiments are explained by taking an elastic wave resonator as an example, but the present invention is widely applicable to elastic wave devices having appropriate electrode structures, such as an elastic wave filter including a plurality of IDT electrodes, in addition to the elastic wave resonator.

The conductive film 4 may be made of another metal such as TiAu, Ni, or Cr. The conductive film 4 may be made of a conductive compound such as ZnO or ITO, instead of the metal.

Furthermore, a coating film may be provided so as to protect the whole or a portion of the top surface of the IDT electrode 3. The coating film is preferably made of a material that is easily deposited by sputtering. Thus, for example, SiO$_2$, SiN, AlN, or the like is preferably used.

The Euler angles ($\phi$, $\theta$, $\psi$) may be Euler angles in which the characteristics of plate waves become substantially equivalent according to the following expression (A).

$$F(\phi, \theta, \psi) = F(60° + \phi, -\theta, \psi) \quad \text{Expession (A)}$$
$$= F(60° - \phi, -\theta, 180° - \psi)$$
$$= F(\phi, 180° + \theta, 180° - \psi)$$
$$= F(\phi, \theta, 180° + \psi)$$

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising: a LiTaO$_3$ substrate; and an IDT electrode provided on a main surface of the LiTaO$_3$ substrate and made of Al or predominantly made of Al; and a conductive film provided on a second main surface of the LiTaO$_3$ substrate so as to be opposed to the IDT electrode across the LiTaO$_3$ substrate; wherein the elastic wave device uses a plate wave in an SH0 mode that is a basic mode of SH waves; and a wavelength-normalized thickness of the LiTaO$_3$ substrate that is a thickness of the LiTaO$_3$ substrate normalized by a wavelength determined by a pitch of electrode fingers of the IDT electrode and an Al equivalent wavelength-normalized thickness of the IDT electrode satisfy any one of combinations listed in Table 1:

TABLE 1

| | |
|---|---|
| (a) | The wavelength-normalized thickness is about 0.01 or more and about 0.30 or less, and the wavelength-normalized thickness of Al is about 0.04 or more and about 0.1 or less |
| (b) | The wavelength-normalized thickness is about 0.01 or more and about 0.70 or less, and the wavelength-normalized thickness of Al is about 0.04 or more and about 0.08 or less. |

2. The elastic wave device according to claim 1, wherein Euler angles of the LiTaO$_3$ substrate are within the ranges of (0°±5°, 120°±10°, 0°±5°).

3. The elastic wave device according to claim 1, wherein the conductive film is another IDT electrode.

4. The elastic wave device according to claim 1, wherein a duty of the IDT electrode is about 0.5.

5. An elastic wave device comprising: a LiTaO$_3$ substrate; and an IDT electrode provided on a main surface of the LiTaO$_3$ substrate and made of Al or predominantly made of Al; and a conductive film provided on a second main surface of the LiTaO$_3$ substrate so as to be opposed to the IDT electrode across the LiTaO$_3$ substrate; wherein the elastic wave device uses a plate wave in an SH0 mode that is a basic mode of SH waves; and a wavelength-normalized thickness of the LiTaO$_3$ substrate that is a thickness of the LiTaO$_3$ substrate normalized by a wavelength determined by a pitch of electrode fingers of the IDT electrode and a duty of the IDT electrode satisfy any one of combinations listed in Table 2:

TABLE 2

| | |
|---|---|
| (a) | The wavelength-normalized thickness is about 0.07 or more and about 0.21 or less, and the duty is about 0.3 or more and about 0.7 or less |
| (b) | The wavelength-normalized thickness is about 0.03 or more and about 0.27 or less, and the duty is about 0.3 or more and about 0.6 or less |
| (c) | The wavelength-normalized thickness is about 0.01 or more and about 0.30 or less, and the duty is about 0.3 or more and about 0.5 or less |
| (d) | The wavelength-normalized thickness is about 0.01 or more and about 0.32 or less, and the duty is about 0.3 or more and about 0.4 or less. |

6. The elastic wave device according to claim 5, wherein Euler angles of the LiTaO$_3$ substrate are within the ranges of (0°±5°, 120°±10°, 0°±5°).

7. The elastic wave device according to claim 5, wherein the conductive film is another IDT electrode.

8. An elastic wave device comprising: a LiTaO$_3$ substrate including a first main surface and a second main surface on an opposite side of the first main surface; an IDT electrode provided on the first main surface of the LiTaO$_3$ substrate and made of Al or predominantly made of Al; and a conductive film provided on the second main surface of the LiTaO$_3$ substrate so as to be opposed to the IDT electrode across the LiTaO$_3$ substrate; wherein the elastic wave device uses a plate wave in an SH0 mode that is a basic mode of SH waves; the conductive film is not short-circuited; and a wavelength-normalized thickness of the LiTaO$_3$ substrate that is a thickness of the LiTaO$_3$ substrate normalized by a wavelength determined by a pitch of electrode fingers of the IDT electrode and an Al equivalent wavelength-normalized thickness of the IDT electrode satisfy any one of combinations listed in Table 3:

TABLE 3

| | |
|---|---|
| (a) | The wavelength-normalized thickness is about 0.01 or more and about 0.59 or less, and the wavelength-normalized thickness of Al is about 0.04 or more and about 0.1 or less |
| (b) | The wavelength-normalized thickness is about 0.01 or more and about 0.70 or less, and the wavelength-normalized thickness of Al is about 0.04 or more and about 0.08 or less. |

9. The elastic wave device according to claim 8, wherein Euler angles of the LiTaO$_3$ substrate are within the ranges of (0°±5°, 120°±10°, 0°±5°).

10. The elastic wave device according to claim 8, wherein another IDT electrode is provided on another main surface of the LiTaO$_3$ substrate.

11. The elastic wave device according to claim 8, wherein the conductive film is made of Al and has a thickness of about 50 nm.

12. An elastic wave device comprising: a LiTaO$_3$ substrate including a first main surface and a second main surface on an opposite side of the first main surface; an IDT electrode provided on the first main surface of the LiTaO$_3$ substrate and made of Al or predominantly made of Al; and a conductive film provided on the second main surface of the LiTaO$_3$ substrate so as to be opposed to the IDT electrode across the LiTaO$_3$ substrate; wherein the elastic wave device uses a plate wave in an SH0 mode that is a basic mode of SH waves; the conductive film is not short-circuited; and a wavelength-normalized thickness of the LiTaO$_3$ substrate that is a thickness of the LiTaO$_3$ substrate normalized by a wavelength determined by a pitch of electrode fingers of the IDT electrode and a duty of the IDT electrode satisfy any one of combinations listed in Table 4:

TABLE 4

| | |
|---|---|
| (a) | The wavelength-normalized thickness is about 0.05 or more and about 0.45 or less, and the duty is about 0.3 or more and about 0.7 or less |
| (b) | The wavelength-normalized thickness is about 0.02 or more and about 0.52 or less, and the duty is about 0.3 or more and about 0.6 or less |
| (c) | The wavelength-normalized thickness is about 0.01 or more and about 0.58 or less, and the duty is about 0.3 or more and about 0.5 or less |
| (d) | The wavelength-normalized thickness is about 0.01 or more and about 0.66 or less, and the duty is about 0.3 or more and about 0.4 or less. |

13. The elastic wave device according to claim 12, wherein Euler angles of the LiTaO$_3$ substrate are within the ranges of (0°±5°, 120°±10°, 0°±5°).

14. The elastic wave device according to claim 12, wherein another IDT electrode is provided on another main surface of the LiTaO$_3$ substrate.

15. The elastic wave device according to claim 12, wherein the conductive film is made of Al and has a thickness of about 50 nm.

16. An elastic wave device comprising: a LiTaO$_3$ substrate including a first main surface and a second main surface on an opposite side of the first main surface; an IDT electrode provided on the first main surface of the LiTaO$_3$ substrate and made of Al or predominantly made of Al; and a conductive film provided on the second main surface of the LiTaO$_3$ substrate so as to be opposed to the IDT electrode across the LiTaO$_3$ substrate; wherein the elastic wave device uses a plate wave in an SH0 mode that is a basic mode of SH waves; the conductive film is short-circuited; and a wavelength-normalized thickness of the LiTaO$_3$ substrate that is a thickness of the LiTaO$_3$ substrate normalized by a wavelength determined by a pitch of electrode fingers of the IDT electrode and an Al equivalent wavelength-normalized thickness of the IDT electrode satisfy any one of combinations listed in Table 5:

TABLE 5

| | |
|---|---|
| (a) | The wavelength-normalized thickness is about 0.01 or more and about 0.7 or less, and the wavelength-normalized thickness of Al is about 0.04 or more and about 0.1 or less. |

17. The elastic wave device according to claim 16, wherein Euler angles of the LiTaO$_3$ substrate are within the ranges of (0°±5°, 120°±10°, 0°±5°).

18. The elastic wave device according to claim 16, wherein another IDT electrode is provided on another main surface of the LiTaO$_3$ substrate.

19. The elastic wave device according to claim 16, wherein the conductive film is made of Al and has a thickness of about 50 nm.

20. An elastic wave device comprising: a LiTaO$_3$ substrate including a first main surface and a second main surface on an opposite side of the first main surface; an IDT electrode provided on the first main surface of the LiTaO$_3$ substrate and made of Al or predominantly made of Al; and a conductive film provided on the second main surface of the LiTaO$_3$ substrate so as to be opposed to the IDT electrode across the LiTaO$_3$ substrate; wherein the elastic wave device uses a plate wave in an SH0 mode that is a basic mode of SH waves; the conductive film is short-circuited; and a wavelength-normalized thickness of the LiTaO$_3$ substrate that is a thickness of the LiTaO$_3$ substrate normalized by a wavelength determined by a pitch of electrode fingers of the IDT electrode and a duty of the IDT electrode satisfy any one of combinations in Table 6:

TABLE 6

| | |
|---|---|
| (a) | The wavelength-normalized thickness is about 0.05 or more and about 0.60 or less, and the duty is about 0.3 or more and about 0.7 or less |
| (b) | The wavelength-normalized thickness is about 0.02 or more and about 0.68 or less, and the duty is about 0.3 or more and about 0.6 or less |
| (c) | The wavelength-normalized thickness is about 0.01 or more and about 0.70 or less, and the duty is about 0.3 or more and about 0.5 or less. |

* * * * *